(12) United States Patent
Lee

(10) Patent No.: US 9,726,693 B2
(45) Date of Patent: Aug. 8, 2017

(54) PROBE MEMBER FOR POGO PIN

(71) Applicant: ISC CO., LTD., Jungwon-gu, Seongnam-si, Gyeonggi-do (KR)

(72) Inventor: Jae-Hak Lee, Seongnam-si (KR)

(73) Assignee: ISC CO., LTD., Seongnam-si, Gyeonggi-Do (KR)

( * ) Notice: Subject to any disclaimer, the term of this patent is extended or adjusted under 35 U.S.C. 154(b) by 157 days.

(21) Appl. No.: 14/256,184

(22) Filed: Apr. 18, 2014

(65) Prior Publication Data

US 2014/0320159 A1 Oct. 30, 2014

(30) Foreign Application Priority Data

Apr. 18, 2013 (KR) .................. 10-2013-0043095

(51) Int. Cl.
*G01R 31/00* (2006.01)
*G01R 1/067* (2006.01)

(52) U.S. Cl.
CPC ..... *G01R 1/06722* (2013.01); *G01R 1/06738* (2013.01)

(58) Field of Classification Search
CPC ............ G01R 1/06722; G01R 1/06738; G01R 1/06716; G01R 1/07314
USPC ....................................... 324/755.05, 755.04
See application file for complete search history.

(56) References Cited

U.S. PATENT DOCUMENTS

| | | | |
|---|---|---|---|
| 5,557,213 A | 9/1996 | Reuter et al. | |
| 5,865,641 A * | 2/1999 | Swart | H01R 12/714 439/482 |
| 6,396,293 B1 | 5/2002 | Vinther et al. | |
| 6,404,212 B1 * | 6/2002 | Mehta | G01R 31/2887 324/750.22 |
| 6,482,013 B2 * | 11/2002 | Eldridge | B23K 20/004 324/755.05 |
| 6,524,115 B1 | 2/2003 | Gates et al. | |
| 6,677,772 B1 * | 1/2004 | Faull | G01R 1/06722 324/755.05 |
| 6,703,855 B1 | 3/2004 | Wu et al. | |
| 7,271,015 B2 | 9/2007 | Okamoto et al. | |
| 7,400,156 B2 * | 7/2008 | Wu | G01R 1/07357 324/750.21 |
| 7,470,983 B2 * | 12/2008 | Tsukada | H01L 23/373 257/675 |

(Continued)

FOREIGN PATENT DOCUMENTS

| | | |
|---|---|---|
| JP | H0555076 | 7/1993 |
| JP | H0712846 | 1/1995 |

(Continued)

OTHER PUBLICATIONS

Korean Notice of Allowance for Korean Application No. 10-2013-0043095, English translation attached to orignal, Dated Aug. 26, 2014, All together 7 Pages.

(Continued)

*Primary Examiner* — Tung X Nguyen
*Assistant Examiner* — Dominic Hawkins
(74) *Attorney, Agent, or Firm* — Brooks Kushman P.C.

(57) ABSTRACT

Provided is a probe member for a pogo pin, which is used for testing a semiconductor device, and at least a portion of which is inserted into a cylindrical body to be supported by an elastic member and an upper end of which contacts a terminal of the semiconductor device.

15 Claims, 8 Drawing Sheets

(56) References Cited

U.S. PATENT DOCUMENTS

| | | | |
|---|---|---|---|
| 7,545,159 B2 | 6/2009 | Winter | |
| 7,677,901 B1* | 3/2010 | Suzuki | G01R 1/0466 |
| | | | 439/66 |
| 7,728,611 B1* | 6/2010 | Kraynak | G01R 1/06722 |
| | | | 324/754.09 |
| 7,956,627 B2 | 6/2011 | Kasukabe et al. | |
| 8,237,460 B1* | 8/2012 | Park | G01R 3/00 |
| | | | 324/755.11 |
| 8,373,430 B1* | 2/2013 | Sochor | H01R 13/2421 |
| | | | 29/874 |
| 8,523,579 B2* | 9/2013 | Johnston | H01R 13/2421 |
| | | | 439/66 |
| 2003/0222666 A1 | 12/2003 | Kagami | |
| 2004/0232934 A1 | 11/2004 | Sinclair | |
| 2006/0087037 A1* | 4/2006 | Hsu | H01L 21/568 |
| | | | 257/738 |
| 2006/0145719 A1* | 7/2006 | Jeong | G01R 1/0466 |
| | | | 324/754.08 |
| 2007/0012094 A1* | 1/2007 | Degertekin | B82Y 35/00 |
| | | | 73/105 |
| 2007/0018666 A1* | 1/2007 | Barabi | G01R 1/06722 |
| | | | 324/754.14 |
| 2007/0128906 A1 | 6/2007 | Kazama et al. | |
| 2008/0020498 A1 | 1/2008 | Okamoto et al. | |
| 2008/0036484 A1 | 2/2008 | Lee | |
| 2008/0121343 A1* | 5/2008 | Cohen | B81C 1/00126 |
| | | | 156/701 |
| 2008/0180125 A1 | 7/2008 | Lee | |
| 2009/0261851 A1* | 10/2009 | Zhou | G01R 1/06738 |
| | | | 324/755.05 |
| 2009/0291573 A1 | 11/2009 | Eldridge et al. | |
| 2010/0216355 A1* | 8/2010 | Copper | H01R 13/187 |
| | | | 439/805 |
| 2011/0124243 A1* | 5/2011 | Park | B21F 3/02 |
| | | | 439/816 |
| 2011/0248736 A1 | 10/2011 | Kato et al. | |
| 2012/0105090 A1 | 5/2012 | Lee | |
| 2012/0187971 A1 | 7/2012 | Huang | |
| 2012/0249174 A1 | 10/2012 | Suzuki et al. | |
| 2013/0069684 A1 | 3/2013 | Jeong | |
| 2013/0128621 A1* | 5/2013 | Liao | G02F 1/133608 |
| | | | 362/634 |
| 2013/0307574 A1* | 11/2013 | Meng | G01R 1/06705 |
| | | | 324/756.03 |
| 2014/0091824 A1* | 4/2014 | Fledell | H02J 15/00 |
| | | | 324/755.11 |
| 2015/0084658 A1 | 3/2015 | Lee | |

FOREIGN PATENT DOCUMENTS

| | | |
|---|---|---|
| JP | H0723284 | 4/1995 |
| JP | H09320715 | 12/1997 |
| JP | H10144438 | 5/1998 |
| JP | H11185912 | 7/1999 |
| JP | 2000123935 | 4/2000 |
| JP | 2000315556 | 11/2000 |
| JP | 2000329789 | 11/2000 |
| JP | 2001337128 | 12/2001 |
| JP | 2002334761 | 11/2002 |
| JP | 2003217774 | 7/2003 |
| JP | 2003344449 | 12/2003 |
| JP | 2007132681 | 5/2007 |
| JP | 2007178403 | 7/2007 |
| JP | 2008128882 | 6/2008 |
| JP | 2009031111 | 2/2009 |
| JP | 2009139191 | 6/2009 |
| JP | 2010117268 | 5/2010 |
| JP | 2010159997 | 7/2010 |
| JP | 2012132717 | 7/2012 |
| JP | 2012181096 | 9/2012 |
| JP | 2014159517 | 9/2014 |
| JP | 2015116465 | 6/2015 |
| KR | 1020050087400 | 8/2005 |
| KR | 1020060127960 | 12/2006 |
| KR | 1020100005535 | 1/2010 |
| KR | 101064852 | 9/2011 |
| KR | 1020110127010 | 11/2011 |
| KR | 101348206 | 1/2014 |
| TW | 200532207 | 10/2005 |
| TW | 200912320 | 3/2009 |
| TW | I306948 | 3/2009 |
| TW | 201237422 | 9/2012 |
| WO | 2012008541 | 1/2012 |
| WO | 2013162343 | 10/2013 |

OTHER PUBLICATIONS

Korean Notice of Non-Final Rejection for KR 10-2013-0043095, English Translation attached to original, Completed by the Korean Patent Office, Dated Apr. 14, 2014, All together 47 Pages.

Japanese Office Action for Japanese Application No. JP 2014-159499, Completed by the Japanese Patent Office, Date Jul. 28, 2015, 3 Pages.

Japanese Office Action for Japanese Application No. JP 2014-159499, Completed by the Japanese Patent Office, Dated Apr. 12, 2016, 4 Pages.

* cited by examiner

PROBE MEMBER FOR POGO PIN

RELATED APPLICATION

This application claims the benefit of Korean Patent Application No. 10-2013-0043095, filed on Apr. 18, 2013, in the Korean Intellectual Property Office, the disclosure of which is incorporated herein in its entirety by reference.

BACKGROUND

1. Field

One or more embodiments of the present invention relate to a probe member for a pogo pin, and more particularly, to a probe member for a pogo pin that reliably contacts a terminal of a semiconductor device so as to be electrically connected well.

2. Description of the Related Art

Generally, in order to test electrical characteristics of semiconductor devices, a semiconductor device needs to have a stable electrical connection with a test device. Generally, a test socket is used as a device for the connection between the semiconductor device and the test device.

The test socket connects a terminal of the semiconductor device and a pad of the test device so that electrical signals may be exchanged bidirectionally. To this end, a pogo pin is used as a contacting unit in the test socket. The pogo pin includes a spring to easily connect the semiconductor device and the test device and to absorb a mechanical shock which may occur during the connection, and thus, it is used in most test sockets.

FIG. 1 schematically illustrates a general pogo pin.

A semiconductor device 1 that is a tested device includes an external connection terminal 2, and a test substrate 8 including a substrate pad 9 is disposed to correspond to the external connection terminal 2. In addition, a pogo pin 3 is located between the semiconductor device 1 and the test substrate 8 to electrically connect the semiconductor device 1 and the test substrate 8 to each other. In FIG. 1, a body of the test socket is omitted. As shown in FIG. 1, the pogo pin 3 includes an upper plunger 5 and a lower plunger 6 on opposite ends of a body 4, and a spring 7 is inserted into the body 4. Accordingly, the spring 7 applies an elastic force to the upper plunger 5 and the lower plunger 6 in a direction in which the upper and lower plungers 5 and 6 are apart from each other. Here, the upper plunger 5 is connected to the external connection terminal 2 of the semiconductor device 1, and the lower plunger 6 is connected to the substrate pad 9 of the test substrate 8. Accordingly, the external connection terminal 2 and the substrate pad 9 are electrically connected to each other. That is, when an end of the upper plunger 5 contacts the external connection terminal 2 of the semiconductor device 1 and an end of the lower plunger 6 contacts the substrate pad 9 of the test substrate 8, the external connection terminal 2 and the substrate pad 9 are electrically connected to each other.

Another conventional pogo pin is disclosed in Korean Patent Application No. 10-2011-0127010. In particular, FIGS. 2 and 3 illustrate a pogo pin for semiconductor testing that electrically connects a semiconductor device (not shown) to a test substrate (not shown) to test the semiconductor. The pogo pin includes a first plunger 20, a second plunger 30, and an elastic member 40. A movement space penetrated on two sides is formed in the first plunger 20. The second plunger 30 is formed of a conductive material. Also, the second plunger 30 is inserted into the movement space of the first plunger 20 so that an end of the second plunger 30 selectively protrudes over a contact exit 22' on a side of the movement space. The elastic member 40 is inserted between the first plunger 20 and the second plunger 30 to apply an elastic force in a direction in which the first plunger 20 and the second plunger 30 are apart from each other. An end of the second plunger 30 is connected to a substrate pad of the test substrate and the other end of the second plunger 30 is exposed outwards from the contact exit formed on one side of the movement space of the first plunger 20 by a relative movement of the first plunger 20 and the second plunger 30, to be connected to an external connection terminal of the semiconductor device.

The above-described pogo pins have the following problems.

A probe of the pogo pin is manufactured mechanically or manufactured by a general plating method. Thus, it is difficult to realize a shape of the probe according to an intention of a user.

That is, it is difficult to realize the probe having a desired shape in a desired place. Also, it is difficult to realize various shapes of probes having different materials or different heights.

PRIOR TECHNICAL REFERENCE

Patent Reference

Korean Patent Application No. 10-2011-0127010

SUMMARY

One or more embodiments of the present invention include a probe member for a pogo pin, whereby the pogo pin may be realized having a desired shape of probes, or the pogo pin may be realized as desired by a designer by forming probes by using different materials.

Additional aspects will be set forth in part in the description which follows and, in part, will be apparent from the description, or may be learned by practice of the presented embodiments.

According to one or more embodiments of the present invention, a probe member for a pogo pin, which is used for testing a semiconductor device, and at least a portion of which is inserted into a cylindrical body to be supported by an elastic member and an upper end of which contacts a terminal of the semiconductor device, includes: a first probe plate that includes a first probe portion including in an upper end thereof a probe contacting the terminal of the semiconductor device, and a first combining portion extending downwards from the first probe portion to be inserted into the cylindrical body and combined with the cylindrical body; and a second probe plate that includes a second probe portion including in an upper end thereof a probe contacting the terminal of the semiconductor device, and a second combining portion extending downwards from the second probe portion to be inserted into the cylindrical body and combined with the cylindrical body, wherein the first probe plate and the second probe plate are integrally connected to each other.

The first probe plate and the second probe plate may be formed of different materials from each other.

The first probe plate may be formed of a material having a higher hardness than a material forming the second probe plate.

The second probe plate may be formed of a material having a better conductivity than a material forming the first probe plate.

When the first probe plate and the second probe plate are integrated, an uppermost height of the probe of the first probe plate and an uppermost height of the probe of the second probe plate may be different from each other.

The uppermost height of the probe of the first probe plate may be greater than the uppermost height of the probe of the second probe plate, and the first probe plate may be formed of a material having a higher hardness than a material forming the second probe plate.

The probe member may further include a third probe plate including: a third probe portion which includes in an upper end thereof a probe contacting the terminal of the semiconductor device, and which has a shape different from a shape of the second probe portion; and a third combining portion which extends downwards from the third probe portion to be inserted into the cylindrical body and combined with the cylindrical body, wherein the third probe plate may be arranged at a location opposite to the first probe plate with the second probe plate between the third probe plate and the first probe plate and may be integrated with the second probe plate.

The first probe plate and the third probe plate may be formed of materials having a higher hardness than a material forming the second probe plate.

According to one or more embodiments of the present invention, a probe member for a pogo pin, which is used for testing a semiconductor device, and at least a portion of which is inserted into a cylindrical body to be supported by an elastic member and an upper end of which contacts a terminal of the semiconductor device, includes: a probe portion including in an upper end thereof a probe contacting the terminal of the semiconductor device; and a combining portion extending downwards from the probe portion to be inserted into the cylindrical body and combined with the cylindrical body, wherein a plurality of probe plates having different cross-sectional shapes, when taken along a vertical direction, are integrated.

At least one of the plurality of probe plates may have a higher hardness than other probe plates.

At least one of the plurality of probe plates may have a different thickness from other probe plates.

A probe of at least one of the plurality of probe plates may have a different height from probes of other probe plates.

A number of probes of at least one of the plurality of probe plates may be different from a number of probes of other probe plates.

According to one or more embodiments of the present invention, a probe member for a pogo pin, which is used for testing a semiconductor device, and at least a portion of which is inserted into a cylindrical body to be supported by an elastic member and an upper end of which contacts a terminal of the semiconductor device, includes: a probe portion including in an upper end thereof a probe contacting the terminal of the semiconductor device; and a combining portion extending downwards from the probe portion to be inserted into the cylindrical body and combined with the cylindrical body, wherein a plurality of probe plates having predetermined shapes in a direction perpendicular to a vertical direction are integrated.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
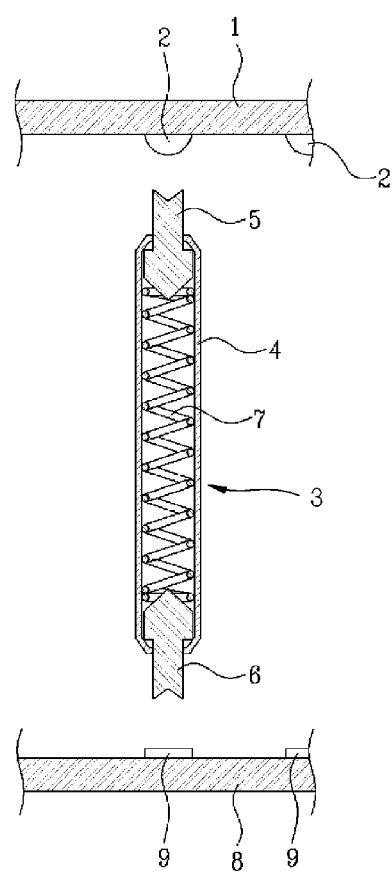
FIG. 1 is a schematic view of a general pogo pin.
Figure 2:
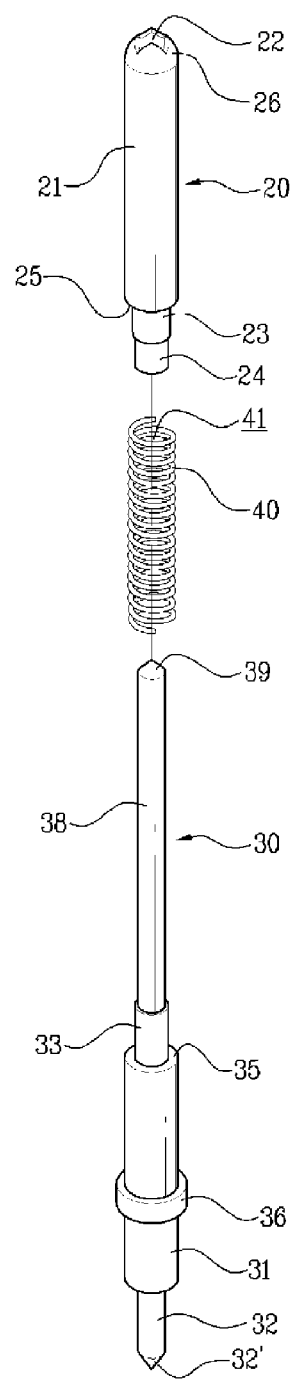
FIG. 2 is an exploded perspective view of a general pogo pin.
Figure 3:
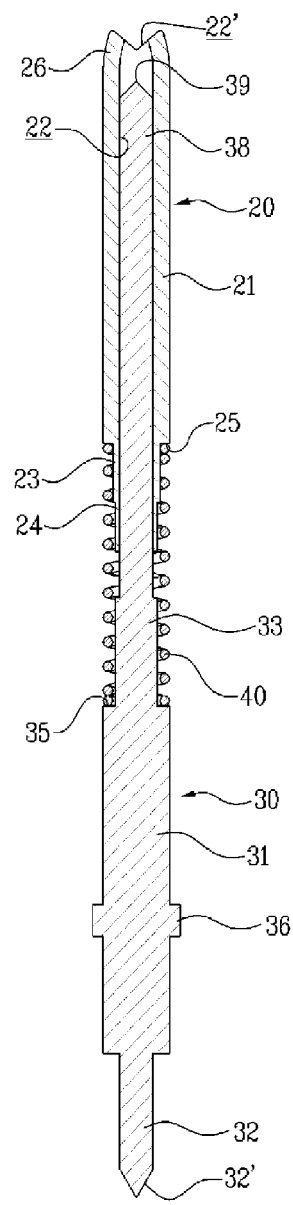
FIG. 3 is a cross sectional view of FIG. 2.

Hereinafter, a probe member for a pogo pin according to an embodiment of the present invention will be described in detail with reference to attached drawings.

The probe member for the pogo pin 110 according to the present embodiment is used for testing a semiconductor device 150. At least a portion of the probe member for the pogo pin 110 is inserted into a cylindrical body 120 to be supported by an elastic member 130, and an upper end of the probe member for the pogo pin 110 contacts a terminal 151 of the semiconductor device 150.

In the probe member for the pogo pin 110, a plurality of probe plates formed of a probe portion and a combining portion are integrated and attached to one another. In detail, each of the probe plates includes the probe portion and the combining portion, and the probe plates, each having a different shape, are integrated and attached to one another. Here, the probe plates may have approximately thin plate shapes.

Figure 4:
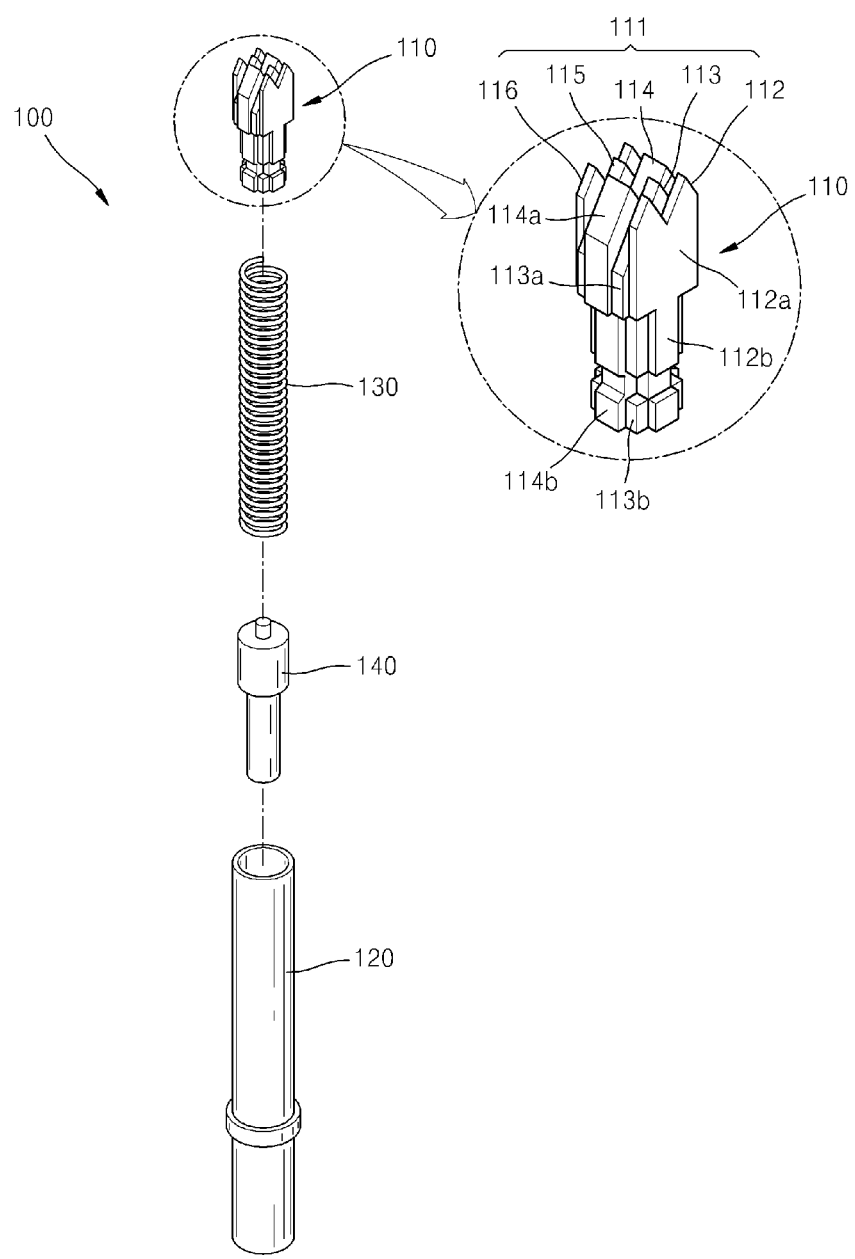
FIG. 4 is a perspective view of a pogo pin including a probe member for a pogo pin according to an embodiment of the present invention.
Figure 5:
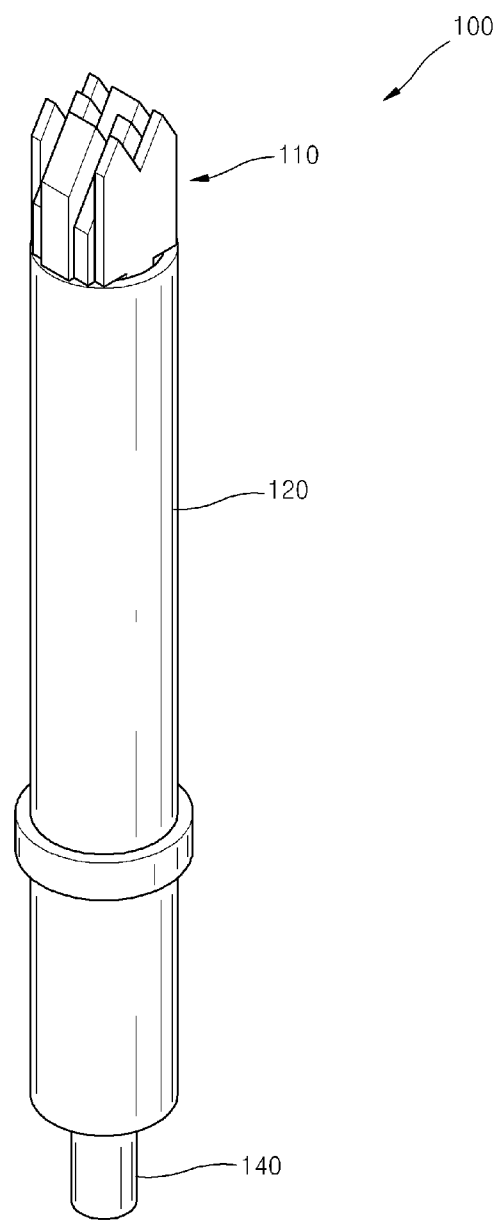
FIG. 5 is a combined perspective view of FIG. 4.

The probe plates 111 may be divided as below. For example, in the probe member for the pogo pin 110 of FIG. 4, the probe plate 111 which is located in the front line is referred to as a first probe plate 112, and the probe plates 111 which are located behind the first probe plate 112 are referred to as a second probe plate 113, a third probe plate 114, a fourth probe plate 115, and a fifth probe plate 116. Each of the probe plates 111 has the following characteristics.

First, the first probe plate 112 includes a first probe portion 112a including in an upper end thereof a probe contacting the terminal 151 of the semiconductor device 150, and a first combining portion 112b extending downwards from the first probe portion 112a to be inserted into the cylindrical body 120 and combined with the cylindrical body 120.

In particular, the first probe plate 112 is formed as a thin plate shape, and the first probe portion 112a has a quadrangular shape and has two projections in an upper portion thereof.

The first combining portion 112b extends downwards from the first probe portion 112a and has a rectangular shape having a smaller width than the first probe portion 112a.

The second probe plate 113 is adjacently integrated with the first probe plate 112 and includes a second probe portion 113a and a second combining portion 113b.

The second probe portion 113a of the second probe plate 113 includes in an upper end thereof a probe contacting the terminal 151 of the semiconductor device 150 and has a different shape from the first probe portion 112a. In detail, the second probe portion 113a has a greater width than the first probe portion 112a and has a single projection. Here, the second probe portion 113a may include a single probe. Also, the second probe portion 113a has a greater thickness than the first probe portion 112a.

The second combining portion 113b extends downwards from the second probe portion 113a to be inserted into the cylindrical body 120 and combined with the cylindrical body 120.

The second combining portion 113b has a rectangular shape having a smaller width than the second probe portion 113a. Also, the width of the second combining portion 113b may be greater than the width of the first combining portion 112b.

The third probe plate 114 is formed as a thin plate shape and includes a third probe portion 114a and a third combining portion 114b. The third probe portion 114a is arranged adjacent to the second probe portion 113a and at a location opposite to the first probe portion 112a with the second probe portion 113a between the third probe portion 114a and the first probe portion 112a.

The third probe portion 114a has a different shape from the second probe portion 113a. In detail, the third probe portion 114a has a greater thickness than the second probe portion 113a, and a shape of projections forming the probe and the number of probes are different between the third probe portion 114a and the second probe portion 113a.

The third combining portion 114b extends downwards from the third probe portion 114a and is inserted into the cylindrical body 120 to be combined with the cylindrical body 120. The third combining portion 114b has a smaller width than the third probe portion 114a.

Meanwhile, the fourth probe plate 115 includes a fourth probe portion and a fourth combining portion, and the fifth probe plate 116 includes a fifth probe portion and a fifth combining portion. Detailed aspects are substantially the same as the above described aspects, and thus, will be omitted here.

Meanwhile, the first probe plate 112 and the second probe plate 113 have different shapes from each other and are formed of different materials from each other. For example, the first probe portion 112a may be formed of a high hardness material, such as a nickel alloy, and the second probe portion 113a may be formed of a metal material having excellent conductivity, such as a metal, for example, silver. Likewise, when the first probe plate 112 and the second probe plate 113 are formed of different materials from each other, the first probe portion 112a may break an impurity material, such as an oxide layer, which may be added to a surface of the terminal 151 of the semiconductor device 150, and the second probe portion 113a may realize excellent conductivity. Naturally, the first probe plate 112 may also facilitate electrical conductivity.

Also, the third probe portion 114a may be formed of a material having a higher hardness than the material forming the second probe portion 113a and the fourth probe portion may be formed of a material having excellent conductivity. In other words, the high hardness material and the high conductivity material may be alternately formed.

Also, when the number of probes of each of the probe plates 111 is different from one another, the probes may be arranged in a zig-zag shape, instead of being located collinearly.

Meanwhile, a structure of a pogo pin 100 including the probe member for the pogo pin 110 according to the present embodiment is as described below. The pogo pin 100 includes the probe member for the pogo pin 110, the cylindrical body 120, the elastic member 130 arranged in the cylindrical body 120 and elastically biasing the probe member for the pogo pin 110 upwards, and a lower probe member 110, at least a portion of which protrudes through a lower opening of the cylindrical body 120 and which is supported by the elastic member 130. Here, the pogo pin 100 is inserted into a housing (not shown) including openings in upward and downward directions.

The probe member for the pogo pin 110 according to the present embodiment has the following operational effects.

Figure 6:
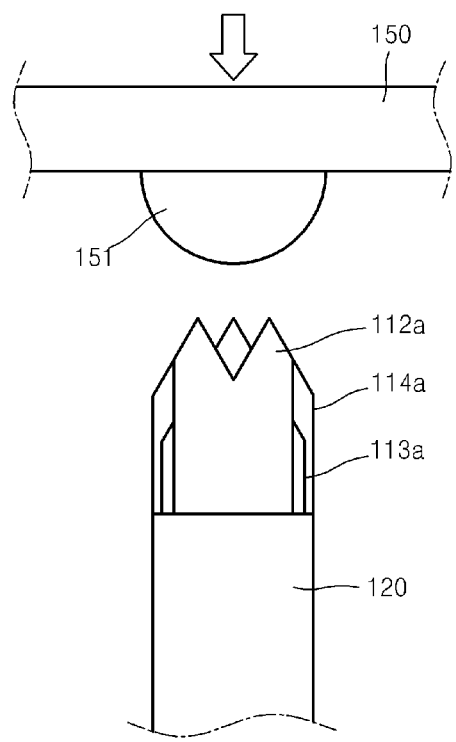
FIGS. 6 and 7 are diagrams for explaining operation of the pogo pin of FIG. 4.
Figure 7:
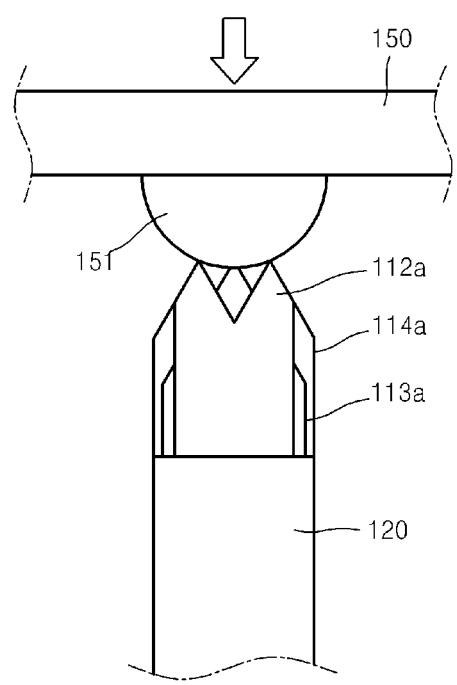
Figure 8:
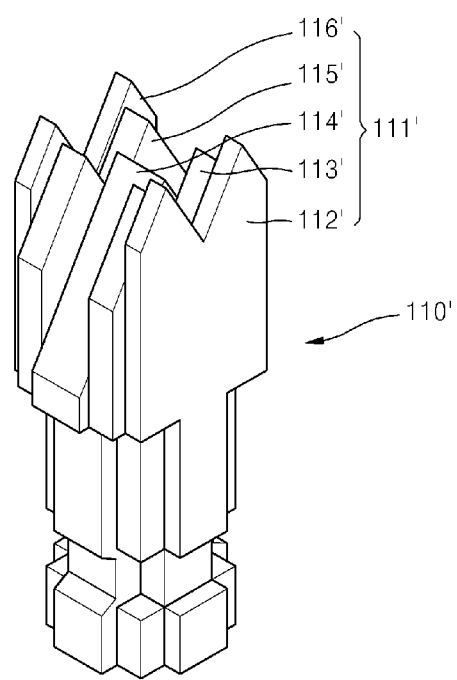
FIG. 8 is a view of a probe member for a pogo pin according to another embodiment of the present invention.

First, when the terminal 151 of the semiconductor device 150 contacts the probe member 110 as illustrated in FIG. 7 as the terminal 151 of the semiconductor device 150 descends as illustrated in FIG. 6, the terminal 151 may effectively contact a plurality of probes of the probe member 110.

In the probe member for the pogo pin 110 according to the present embodiment, the plurality of probe plates 111 are formed by being integrated. Thus, shapes and locations of the probes may be realized in various ways so that an optimum contact shape corresponding to a design condition may be feasible.

Also, when the probe plates 111 contacting the terminal 151 of the semiconductor device 150 are formed of different materials from one another, a probe may mainly serve to remove an impurity from the terminal 151, and another probe may serve to contact the terminal 151 and increase electrical conductivity, thereby leading to a desired effect. For example, when all of the probe plates 111 are formed of the same materials, that is, when all of the probes are formed of high hardness materials, the probes may have low conductivity, which is undesirable in terms of electrical conductivity, whereas when all of the probes are formed of high conductivity materials, the probes may be easily worn out due to a repeated process of contacting the terminal 151. However, according to the present embodiment, the probe plate formed of the high hardness material and the probe plate formed of the material having low hardness and high conductivity are alternately arranged to perform complementary functions.

The probe member for the pogo pin 110 according to the present embodiment may be manufactured as below. First, a conductive layer is formed on a substrate and a dry film is disposed. A predetermined groove is formed in the dry film by a photoresist process and a plating material is applied to the groove to manufacture the first probe plate 112. Then, the dry film is again stacked and a groove of a necessary shape is formed in the dry film. The plating material is applied to the groove to manufacture the second probe plate 113. Such a process is repeated until the fifth probe plate 116 is manufactured. Then, the dry films are removed and the probe member for the pogo pin 110 which is manufactured is separated from the substrate.

Meanwhile, embodiments of the present invention are not limited to the probe member for the pogo pin 110 according to the present embodiment. The probe member for the pogo pin 110 may be changed as below.

That is, a height of the probe of each of the probe plates may be manufactured to be different from one another. For example, a first probe plate 112' may be formed of a material having a higher hardness than a material forming a second probe plate 113', and then, an uppermost height of a probe of the first probe plate 112' may be greater than an uppermost height of a probe of the second probe plate 113'. Like this, when the probe of the first probe plate 112' formed of the high hardness material is located higher, the probe formed of the high hardness material first contacts the terminal of the semiconductor device and removes an impurity from the terminal, and after that, the probe of the second probe plate 113' contacts the terminal to facilitate effective electrical conduction. It is desired that an uppermost end of the probe plate formed of the high hardness material be higher than an uppermost end of the probe plate formed of the material having low hardness.

As described above, according to the one or more of the above embodiments of the present invention, the probe member for the pogo pin includes the plurality of probe plates including the probes, which are integrated and connected, so that the probes may have shapes desired by a manufacturer and each of the probes may have a different material from one another.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A probe member for a pogo pin, which is used for testing a semiconductor device, and at least a portion of which is inserted into a cylindrical body to be supported by an elastic member and an upper end of which contacts a terminal of the semiconductor device, the probe member comprising:
    a flat first probe plate and a flat second probe plate integrally connected parallel to each other in stacked alignment and aligned along a common axis with the cylindrical body;
    wherein the first probe plate that comprises a first probe portion comprising in an upper end thereof a probe contacting the terminal of the semiconductor device to be tested and spaced about the axis, and a first combining portion extending downwards from the first probe portion to be inserted into the cylindrical body and combined with the cylindrical body;
    wherein the second probe plate that comprises a second probe portion comprising in an upper end thereof a probe contacting the terminal of the semiconductor device to be tested and located radially inboard of the first probe portion, and a second combining portion extending downwards from the second probe portion to be inserted into the cylindrical body and combined with the cylindrical body,
    wherein the first probe plate and the second probe plate are formed of different materials from each other.

2. The probe member of claim 1, wherein the first probe plate is formed of a material having a higher hardness than a material forming the second probe plate.

3. The probe member of claim 1, wherein the second probe plate is formed of a material having a better conductivity than a material forming the first probe plate.

4. The probe member of claim 1, wherein when the first probe plate and the second probe plate are integrated, an uppermost height of the probe of the first probe plate and an uppermost height of the probe of the second probe plate are different from each other.

5. The probe member of claim 4, wherein the uppermost height of the probe of the first probe plate is greater than the uppermost height of the probe of the second probe plate, and the first probe plate is formed of a material having a higher hardness than a material forming the second probe plate.

6. The probe member of claim 1, further comprising a third probe plate aligned along the common axis with the first probe plate and the second probe plate wherein the third probe plate comprises a third probe portion which comprises in an upper end thereof a probe contacting the terminal of the semiconductor device and located radially inboard of the second probe portion, and which has a shape different from a shape of the second probe portion; and a third combining portion which extends downwards from the third probe portion to be inserted into the cylindrical body and combined with the cylindrical body.

7. The probe member of claim 6, wherein the first probe plate and the third probe plate are formed of materials having a higher hardness than a material forming the second probe plate.

8. The probe member of claim 6, wherein the third probe differs in at least one of shape and number from the second probe.

9. The probe member of claim 7, wherein the third probe differs in at least one of shape and number from the second probe.

10. The probe member of claim 6, wherein the third probe plate has a greater thickness than the second probe plate.

11. The probe member of claim 7, wherein the third probe plate has a greater thickness than the second probe plate.

12. The probe member of claim 1, wherein the second probe differs in at least one of shape and number from the first probe.

13. The probe member of claim 12, wherein the second probe plate has a greater thickness than the first probe plate.

14. The probe member of claim 1, wherein the second probe plate has a greater thickness than the first probe plate.

15. The probe member of claim 8, wherein the third probe plate has a greater thickness than the second probe plate.

* * * * *